United States Patent [19]

Hayes, Jr.

[11] Patent Number: 5,126,552
[45] Date of Patent: Jun. 30, 1992

[54] INFRATED MATRIX SENSOR WITH SIGNAL MULTIPLEXING

[75] Inventor: Stanley B. Hayes, Jr., Attleboro, Mass.

[73] Assignee: Alpha Omega Instruments Corp., Norton, Mass.

[21] Appl. No.: 678,530

[22] Filed: Mar. 28, 1991

[51] Int. Cl.[5] .......................... G01J 5/22; H01J 40/14; H01L 25/00
[52] U.S. Cl. .................................. 250/208.4; 250/332
[58] Field of Search ...................... 250/349, 332, 208.4, 250/208.1, 203.3, 208.3, 214 R, 214 SW; 382/65, 68; 358/471, 482, 483, 213.16, 213.31

[56] References Cited

U.S. PATENT DOCUMENTS

| | | | |
|---|---|---|---|
| 3,949,162 | 4/1976 | Malueg | 358/213.18 X |
| 4,055,768 | 10/1977 | Bromberg | 250/461.2 |
| 4,223,214 | 9/1980 | Dorian et al. | 250/203.4 |

Primary Examiner—Constantine Hannaher
Assistant Examiner—Edward J. Glick
Attorney, Agent, or Firm—Samuels, Gauthier & Stevens

[57] ABSTRACT

A lead salt detector array where the output voltage of each detector is switched between a signal ground or an amplifier input virtual ground. A switching circuit communicates with each detector. All detectors in the array are switched to a signal ground except for the detector(s) from which it is desired to read a signal. This detector is switched to the amplifier input virtual ground.

11 Claims, 8 Drawing Sheets

INFRATED MATRIX SENSOR WITH SIGNAL MULTIPLEXING

BACKGROUND OF THE INVENTION

Lead salt infrared detectors, Lead Sulfide (PbS) and Lead Selenide (PbSe), as well as other types of photoconductors, have been in use for many years performing many infrared sensing functions quite adequately and at low cost. Generally classified as photoconductors, the lead salt detectors differ from semiconductors in that the response to infrared energy is a change in resistance rather than a change in voltage or current. In a resistive photoconductor of these types it is necessary to convert the detector resistance to a current or voltage for amplification and measurement purposes.

A prior art circuit, shown in FIG. 1, is used to interface with a single detector, D. A bias voltage, which may be as high as several hundred volts in some cases, is used to establish a bias current flowing through the detector, D, and its associated bias resistor, R. Changes in the bias current due to changes in the resistance of the detector result in a change in the voltage at the junction of the detector and the bias resistor. This change in voltage is coupled through capacitor, C, to be amplified and buffered by an amplifier, A. The capacitor C removes the DC component from the junction and allows the AC component of the signal to pass to the amplifier.

Due to the large resistance of the detectors, which can vary from 10k to several megohms at room temperature, and the high temperature sensitivity of the detectors, approximately 3% per °C., the infrared energy sensed by the detector is usually chopped to make the energy appear as an AC signal that can be coupled to an AC amplifier. This precludes using the detectors in a DC mode for most applications. Also, depending on the bias voltage used and the lowest frequency response required, the capacitor C can be quite large, making it difficult to place the amplifier close to the detector or to consider miniaturization techniques such as hybridization.

When multiple lead salt detectors are positioned together in close proximity, they are considered an array and generally a separate circuit, such as the one shown in FIG. 1, is used to interface or buffer each detector of the array. With a reasonable number of detectors in an array, such as sixteen (16) or thirty-two (32), separate amplifying circuits for each detector of the array can perhaps be tolerated. Solid state signal processing can multiplex the low impedance output of each separate amplifier but multiplexing of the detectors directly is difficult due to the bias voltage involved and the time constants associated with the necessary AC coupling.

SUMMARY OF THE INVENTION

Broadly the invention comprises an array of resistance responsive photoconductors (detectors) where the output of the detectors is multiplexed directly by a signal multiplexing network. The output from the network is transmitted to a sensor circuit where the signals are amplified and output. The detectors each have one terminal connected to a bias voltage source. The bias voltage can be the same for all detectors or there may be different bias voltages for different detectors or grouping of detectors. That is, if the detectors are arrayed in a uniform grid, a first line (grouping) of detectors may be at one bias voltage, a second line of detectors at a different bias voltage, a third line of detectors at still a third different bias voltage or a bias voltage the same as the first line of detectors. That is, depending upon the specific detectors used and the sensitivity of the detector array, any combination of groupings, circular, triangular, linear, non-linear, square in uniform or non-uniform patterns, may have any combination of bias voltages applied.

The other terminals of the detectors communicate with the multiplexing network and are connected to either a signal ground or to an amplifier in the sensor circuit which amplifier input is a virtual ground. When connected to the amplifier the signal from the detector is amplified and output.

The invention, in a preferred embodiment, comprises a lead salt detector array where the output voltage of each detector is switched between a signal ground or an amplifier input virtual ground. A switching circuit in the multiplexing network preferably comprises a pair of MOSFETs communicating with each detector. The capacitor/resistance circuit usually associated with such detectors is eliminated thereby overcoming the problem with the time constant and DC voltage removal normally associated with such capacitors. Further, the detectors are equally responsive to both AC and DC signals. In use, all the detectors in the array are switched to a signal ground except for the detector(s) from which it is desired to read a signal. This detector is switched to the amplifier input virtual ground.

In this preferred embodiment, the signals from each of the detectors are sequenced or read into a summing amplifier in seriatim. However, it is to be understood that the sequencing from the detectors does not have to follow a uniform pattern based on the geometric configuration of the detectors. That is, if there is a uniform array of detectors, say 8×8 or 64×64, it is not necessary that sequential reading start with a first detector and then reading across through the eight detectors on that line, left to right, then reading across the eight detectors on the next lower succeeding line, left to right, etc. The detectors can be read up or down, in any uniform or non-uniform geometric pattern. Further, if more than one detector is sensed at the same time, then there would be a separate sensor circuit, if the multiple sensed detectors are to be read out at the same time.

Each individual detector has one of its terminals connected to the bias voltage source, considered a common side. This voltage can be any electrically quiet voltage required for the application, even up to several hundreds of volts depending on the detector type, size and spacing. Each MOSFET pair operates together to control its associated detector. Specifically, the other terminal of each detector is connected to the drain terminal of each of two MOSFET's. The source terminals of one of the MOSFETs of the MOSFET pair are all connected together and to signal ground or zero volts level. The source terminals of the other of the MOSFETs of the MOSFET pair are also connected together and are connected to the summing junction of an operational amplifier (−) which is a virtual ground because the (+) terminal of the operational amplifier is connected to signal ground or the zero volt-level.

Very Large Scale Integrated (VLSI) switching circuits are utilized to sequence the detector elements into the amplifier one at a time. This type of circuitry also lends itself to hybridization or integration of the sensing front end. By placing the hybrid or integrated circuit in close proximity to the detectors, interconnection costs are greatly reduced as is susceptibility to noise pickup.

In the operation of the preferred embodiment, two sixty-four (64) bit shift registers control the gate functions of each MOSFET in each pair in such a manner that all detectors, except the one being measured, are connected to signal ground directly. However, the detector being read at any one time has the MOSFET of the pair normally grounded to signal ground open or OFF. The other of the MOSFET pair is switched ON to connect it into the sensor circuit and to the virtual ground.

In this manner, each detector in the array is either switched to ground directly or to a virtual ground at the summing junction of the operational amplifier. Therefore, the detector is never allowed to have its current cut off and its intrinsic capacitance does not have to be charged and discharged. Also, operation is possible at DC levels since no resistive/capacitive coupling is used.

Because each detector has a finite resistance associated with it even under dark conditions, a current will always be flowing into the summing junction of the amplifier when it is switched into the amplifier. A digital to analog converter (DAC) is used to subtract the dark current that flows for each detector when there is no light falling on it. Therefore, the amplifier will only amplify the difference current that will be directly proportional to any light current that flows.

DESCRIPTION OF THE PREFERRED EMBODIMENT(S)

Figure 1:
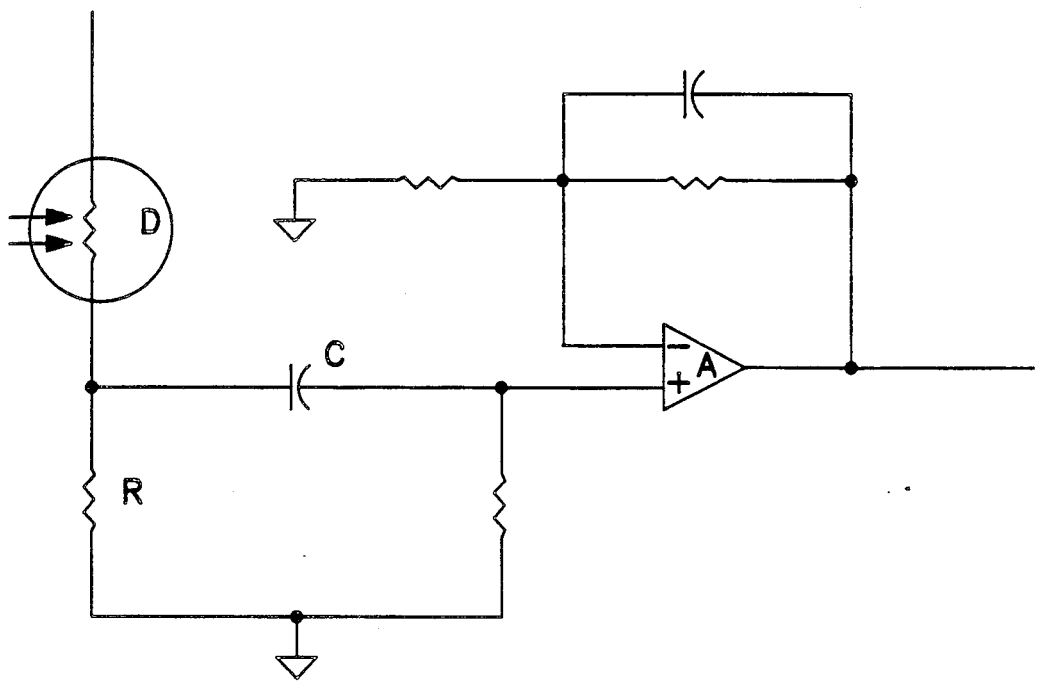
FIG. 1 is a schematic of a prior art circuit for a lead salt detector.
Figure 2:
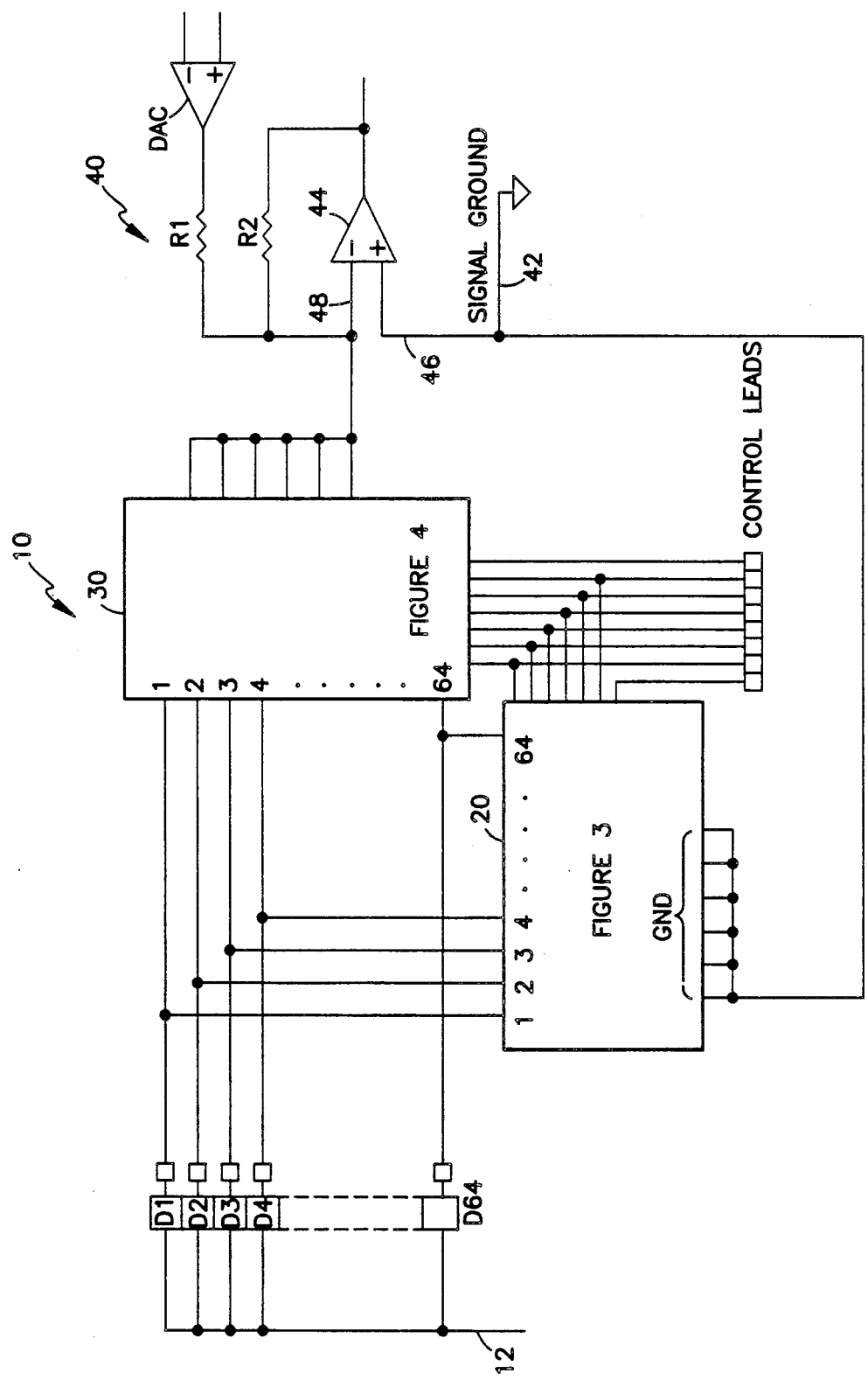
FIG. 2 is a partly functional block diagram partly schematic of a system embodying the invention.

Referring to FIG. 2, a system 10 embodying the invention comprises an array of detectors $D_1$–$D_{64}$, such as New England Photoconductor D1-64-3, a first VLSI switching circuit 20, a second VLSI switching circuit 30, and a sensor circuit 40. The detectors are controlled at a constant temperature by means of thermoelectric coolers or liquid nitrogen (not shown). One of the connections of each of the detectors is connected to a common bias voltage 12 of between 4 of 300 volts, say 100 volts. The other connection of each of the detectors is connected to a pair of MOSFETs, as shown most clearly in FIG. 5.

Figure 3:
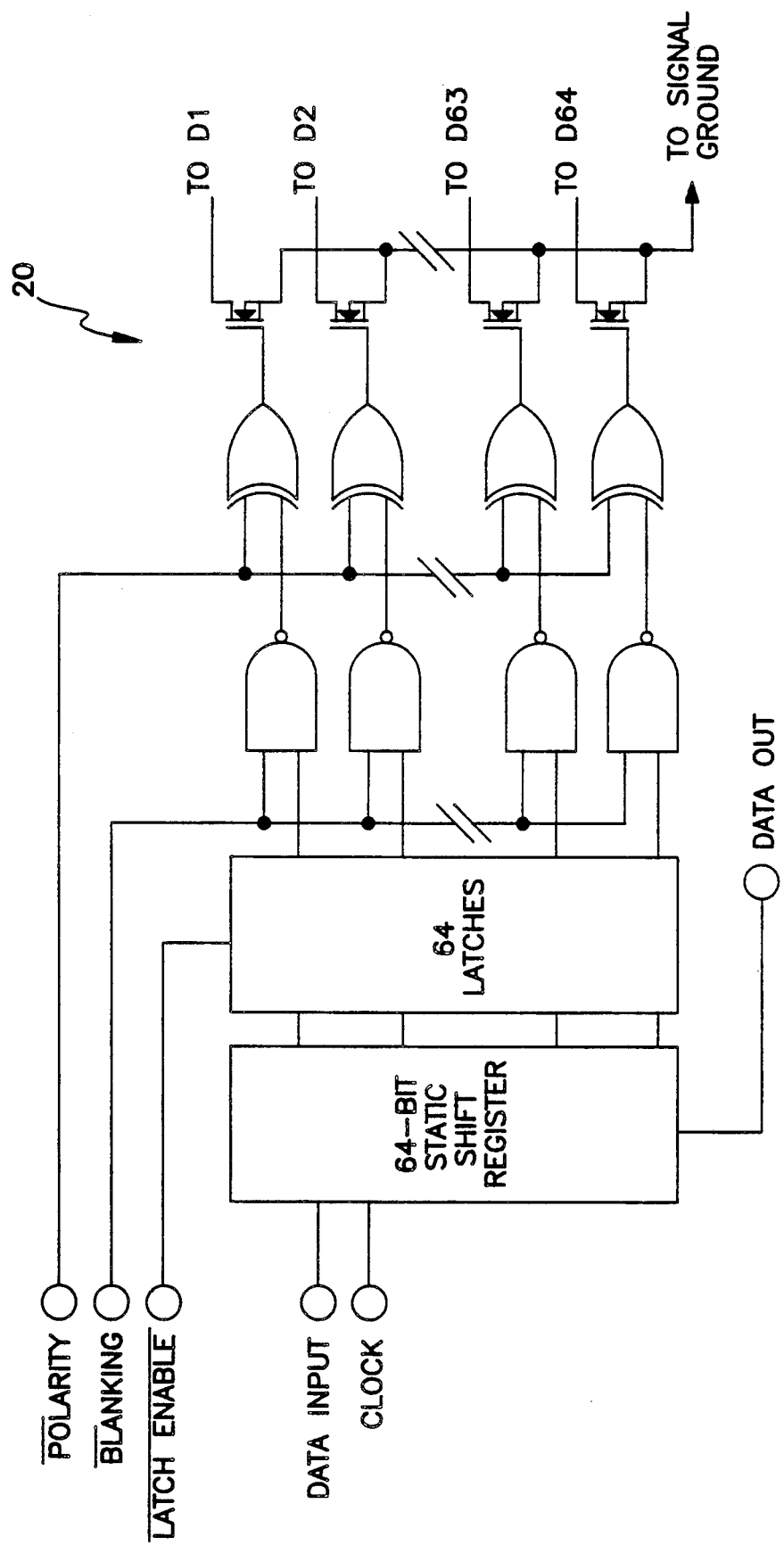
FIG. 3 is a logic diagram of a switching device used in the system of FIG. 2.
Figure 4:
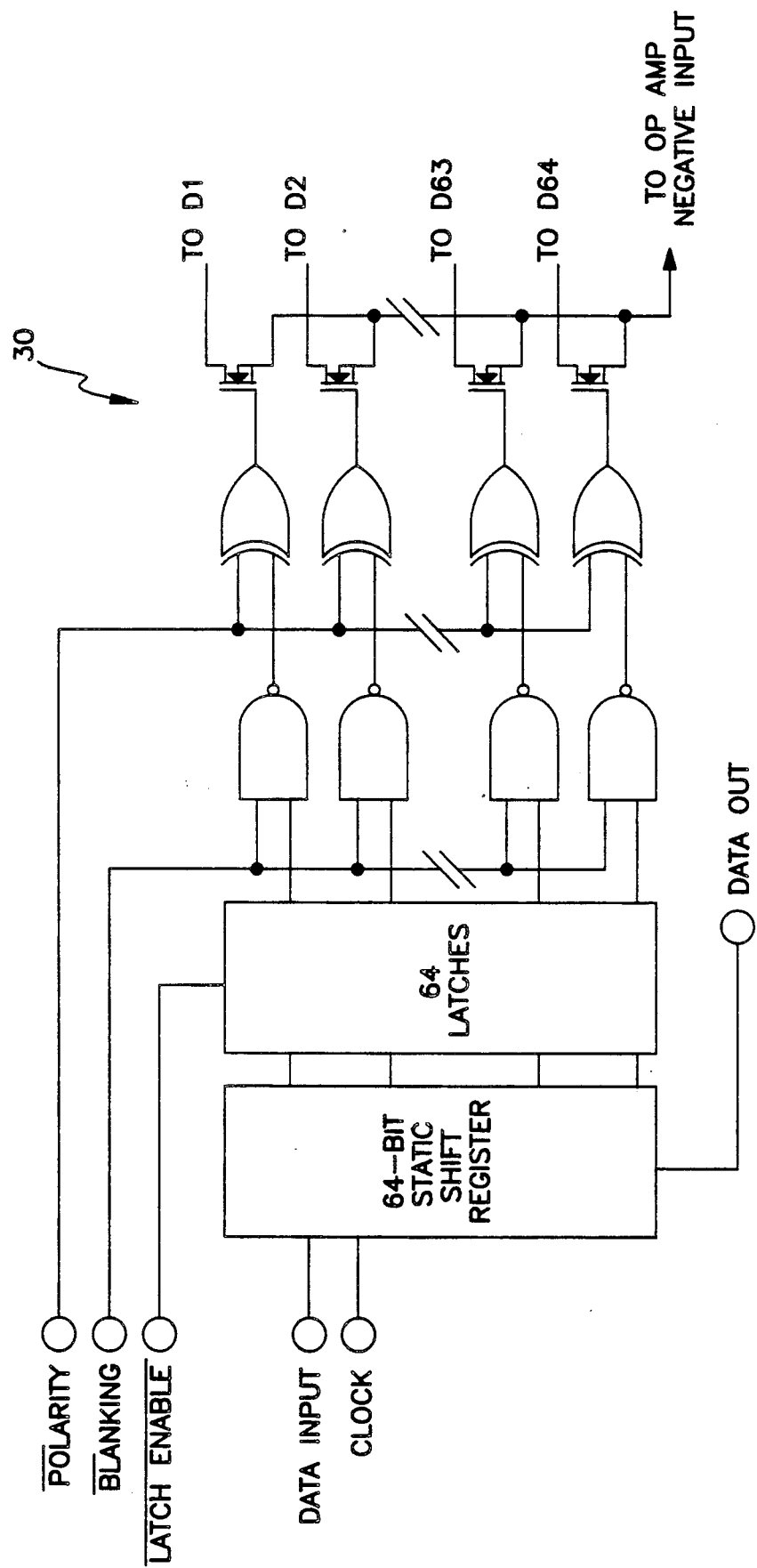
FIG. 4 is a logic diagram of a switching device used in the system of FIG. 2.

Referring to FIG. 3, the first VLSI switching circuit 20, such as a Supertex HV03, is shown in greater detail. Its outputs communicate with the second VLSI switching circuit 30, as shown in FIG. 4. As will be described in the operation of the invention, the VLSI switching circuit 20 controls the gates of a MOSFET, which is one of a pair of MOSFETs, $M_1$, in the switching circuits 20 and 30 such that at any given time, all the MOSFETs to which it is connected are switched ON to ground except the MOSFET in the VLSI switching circuit 20 associated with the detector whose signal is to be measured, which is switched OFF.

The switching circuit 30 is shown in FIG. 4 and is the standard IC chip HV03 identified above with one modification. The connections of the paired MOSFETs $M_1$, $M_2$... $M_{63}$, $M_{64}$ are not grounded (as they are in the standard HV03) but are connected directly to the summing junction of an operational amplifier. The switching circuit 30 controls the gate of the other MOSFET of the pair of MOSFETS such that at any given time, all the MOSFETs to which it is connected are switched OFF except the MOSFET associated with the detector whose signal is to be measured, which is switched ON.

Figure 5:
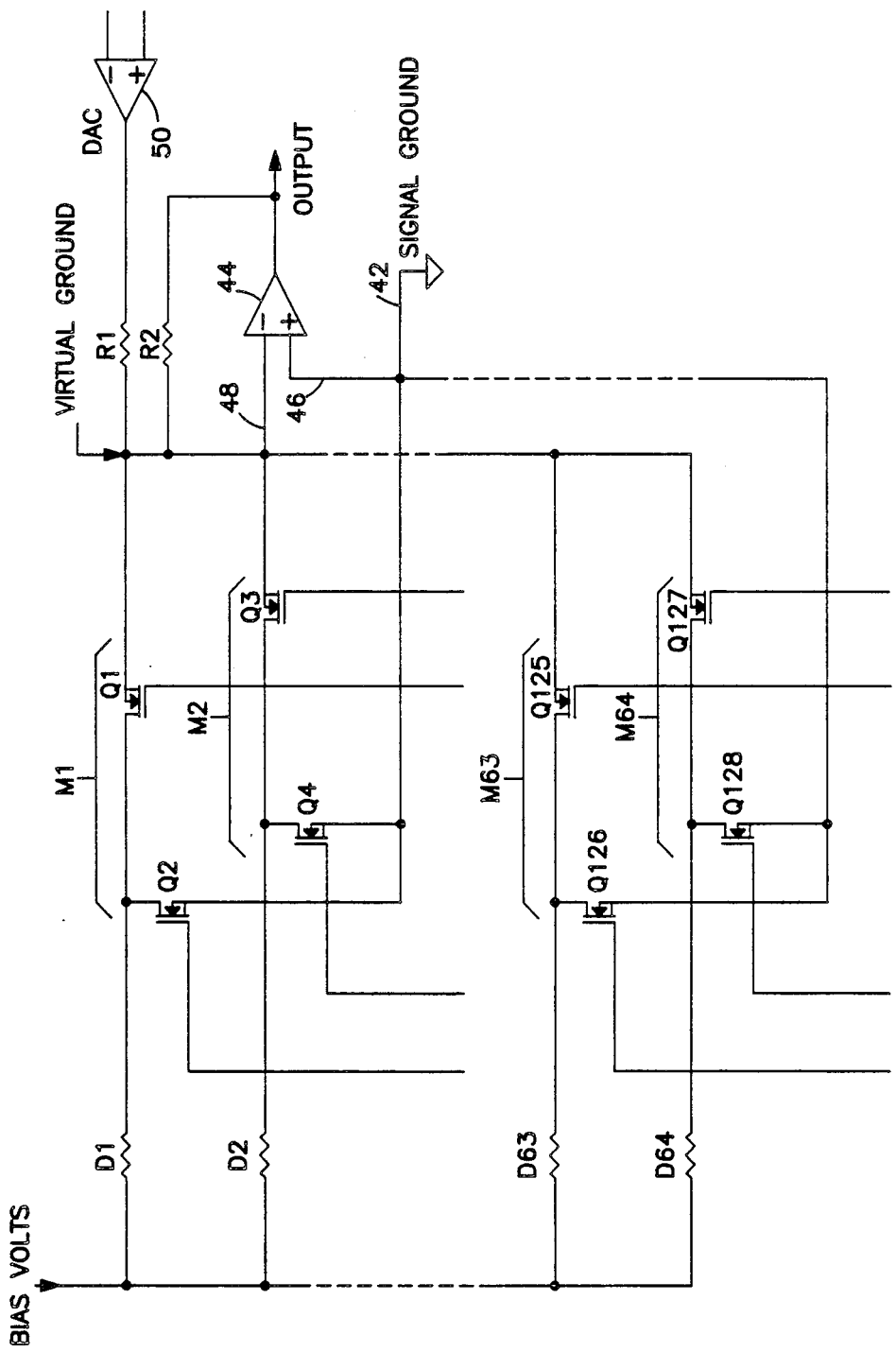
FIG. 5 is a schematic of a switching/sensor system embodying the invention.

Referring to FIG. 5, MOSFET pairs $M_1$, $M_2$... $M_{63}$, $M_{64}$ associated with detectors $D_1$, $D_2$... $D_{63}$, $D_{64}$ are shown in greater detail together with the sensor circuit 40. The detector $D_1$ communicates with the MOSFET pair $M_1$, detector $D_2$ communicates with MOSFET pair $M_2$, etcetera. The MOSFET pair $M_1$ comprises MOSFETs $Q_1$ and $Q_2$; MOSFET $M_2$ comprises MOSFET pairs $Q_{127}$ and $Q_{128}$.

The drain terminals of the MOSFET pairs $Q_1$–$Q_2$, $Q_3$–$Q_4$, etcetera, are connected to their associated detectors. The source terminals of the MOSFETs $Q_2$–$Q_{128}$ (even numbers) are all connected together and to a signal ground 42. The positive input 46 of the operational amplifier 44 is also connected to signal ground 42. The source terminals of $Q_1$–$Q_{127}$ (odd numbers) are connected together and to the summing junction 48 of the operational amplifier 44 (negative input).

As an example, if the signal from detector $D_2$ is to be sensed and displayed, the VLSI switching circuit 20 has all the MOSFETs $Q_2$ and $Q_6$–$Q_{128}$ switched to signal ground (i.e. ON) while the MOSFET $Q_4$ is switched OFF. The VLSI switching circuit 30 has all the MOSFETs $Q_1$ and $Q_5$–$Q_{127}$ switched OFF while the MOSFET $Q_3$ is switched ON, thus the input from detector $D_2$ goes directly to the summing junction 48 of the amplifier 44.

The sensor circuit 40 comprises the transimpedence amplifier 44, such as a Linear Technology LT 1028, and resistor, $R_2$, having a value of approximately 1 meg ohm. The sensor circuit 40 communicates with a digital to analog converter (DAC) 50, such as a National DAC 1232, via $R_1$, for matching the dark current of a detector(s). Specifically, the dark current for detector $D_2$ is approximately 100 microamps with 100 volts bias. A matching current of opposite polarity from the DAC 50 is applied to the summing junction 48 of amplifier 44.

In operation, the bias voltage 12 applied to the detectors $D_1$–$D_{64}$ is positive polarity with respect to ground to properly bias the N channel of the MOSFETs in the switching circuits 20 and 30. The current that flows from the bias voltage source 12 through each respective detector to either ground directly or to the virtual ground when switched to be measured is determined by the magnitude of the bias voltage, the resistance of the detector, and the ON resistance of the respective MOSFET transistor. As in the example above, the current would flow from the bias voltage 12 through detector D2 and through MOSFET $Q_3$ to the summing junction 48 at the negative input to the operational amplifier 44. Since no current flows into or out of the input terminals of an ideal voltage operational amplifier, this detector current has to flow through either $R_1$ or $R_2$ to a negative potential of some value to enable the voltage at the positive input 46 to be at zero volts.

What is done is to establish the negative DAC output voltage necessary to cause all of the dark detector current to flow through $R_1$. When this situation occurs, no current is required to flow through $R_2$ and the amplifier output will be zero. The correction current necessary to produce a zero amplifer output under dark conditions is determined by monitoring the amplifier output and adjusting the DAC output accordingly until the amplifier output is zero under dark conditions. This DAC value necessary to zero the amplifier is stored in the memory of the data processing electronics for each individual detector. Therefore, each output of the amplifier will be zero for each detector under dark conditions. Then as light is allowed to fall on the detectors, the detector resistance will be reduced in proportion to the magnitude of the light falling on it. This increase of current flow through the detector due to the lower detector resistance must now flow through $R_2$ to the amplifier output. The amplifier output will assume a voltage proportional to the light current differential times the value of $R_2$. This analog output digitized by the analog to digital converter for storage and further data processing.

Figure 6:
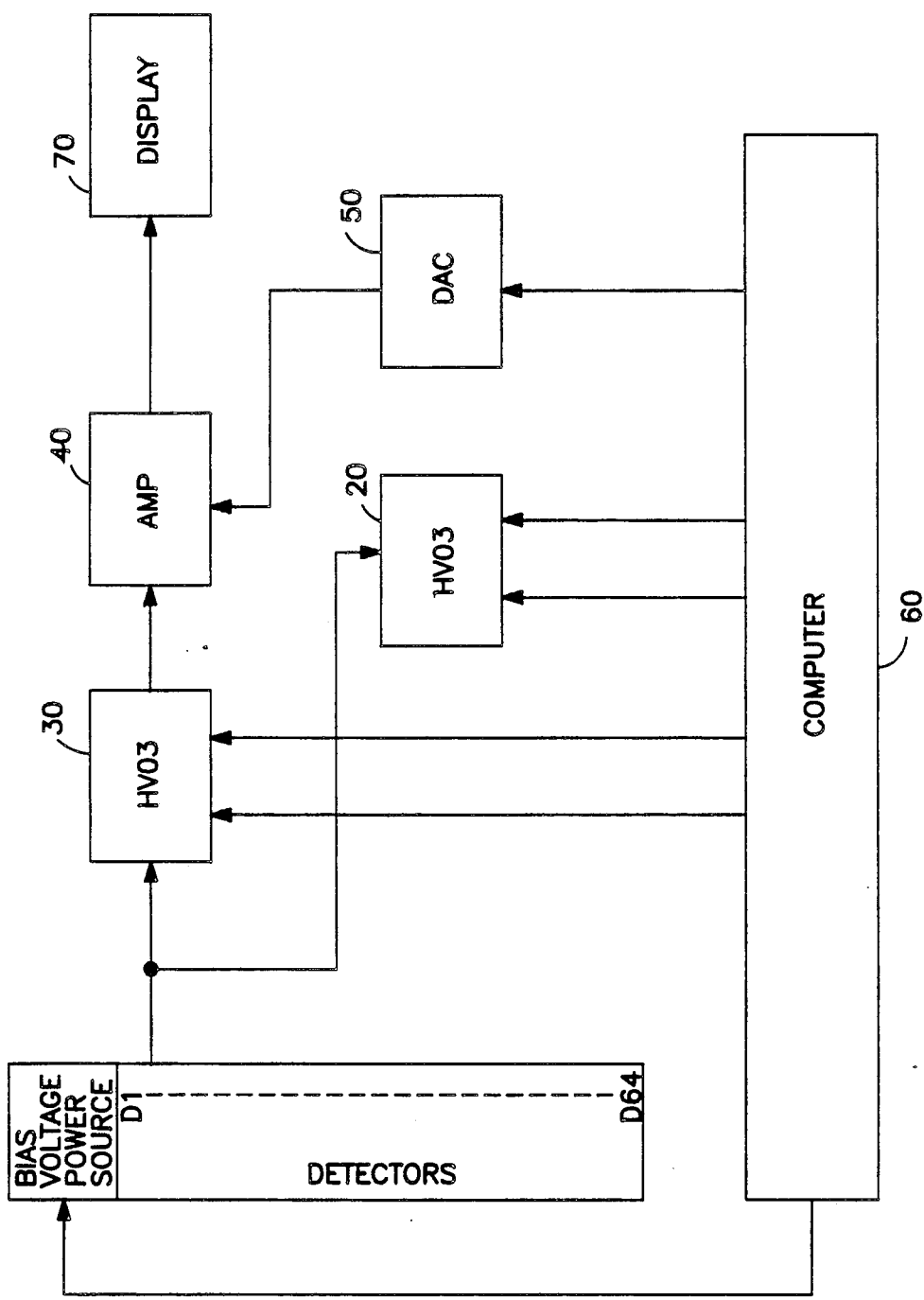
FIG. 6 is a block diagram of the system of FIGS. 1–5.

A computer 60, such as any IBM compatible computer, is shown in FIG. 6. The components shown in FIG. 2 (or FIG. 7) interface with the computer. It is well known to those skilled in the art that computer interface circuits can comprise suitable interfaces and/or analog to digital conversion, digital to analog conversion, storage and computation units while performing arithmetical and logical functions on the data in form. Any standard computer language consistent with the capability of a computer can be used with these instructions. The routines to effect the sequence of operation described in the following section, Operation, are not described in detail because they can be written in any desired notations, formats or sequences depending upon the particular computer being utilized, computer language, etc. Typically, the manufacturer's handbook sets forth the necessary programs which include the sequence of internal interconnections which have been added by preparation and loading of the programs into the internal memory of the computer. Thus, the computer has loaded in the necessary programs to accomplish the described steps in the operation of the invention.

Circuitry to perform the housekeeping functions of clocks, polarities, remembering the individual detector dark current requirements, and control of the DAC levels is well within the skill of the art. Also, additional signal processing may occur whereby zero and gain corrections, threshold determinations, and other mathematical determinations may be made on the data received. The display 70 includes an A/D converter, a digital signal processor and a data storage and display function.

Figure 7:
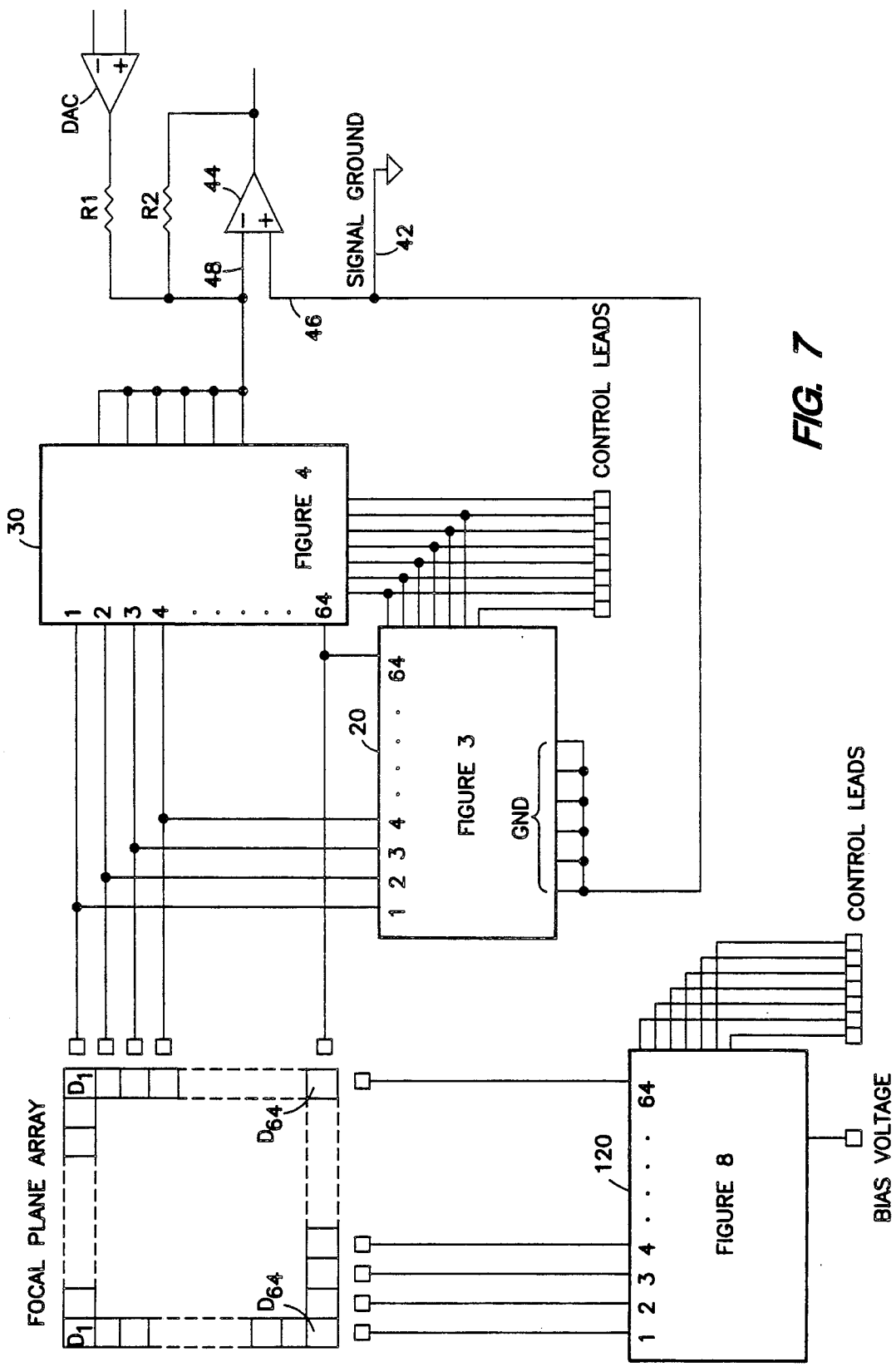
FIG. 7 is a partly functional block diagram partly schematic of an alternative embodiment of the invention.
Figure 8:
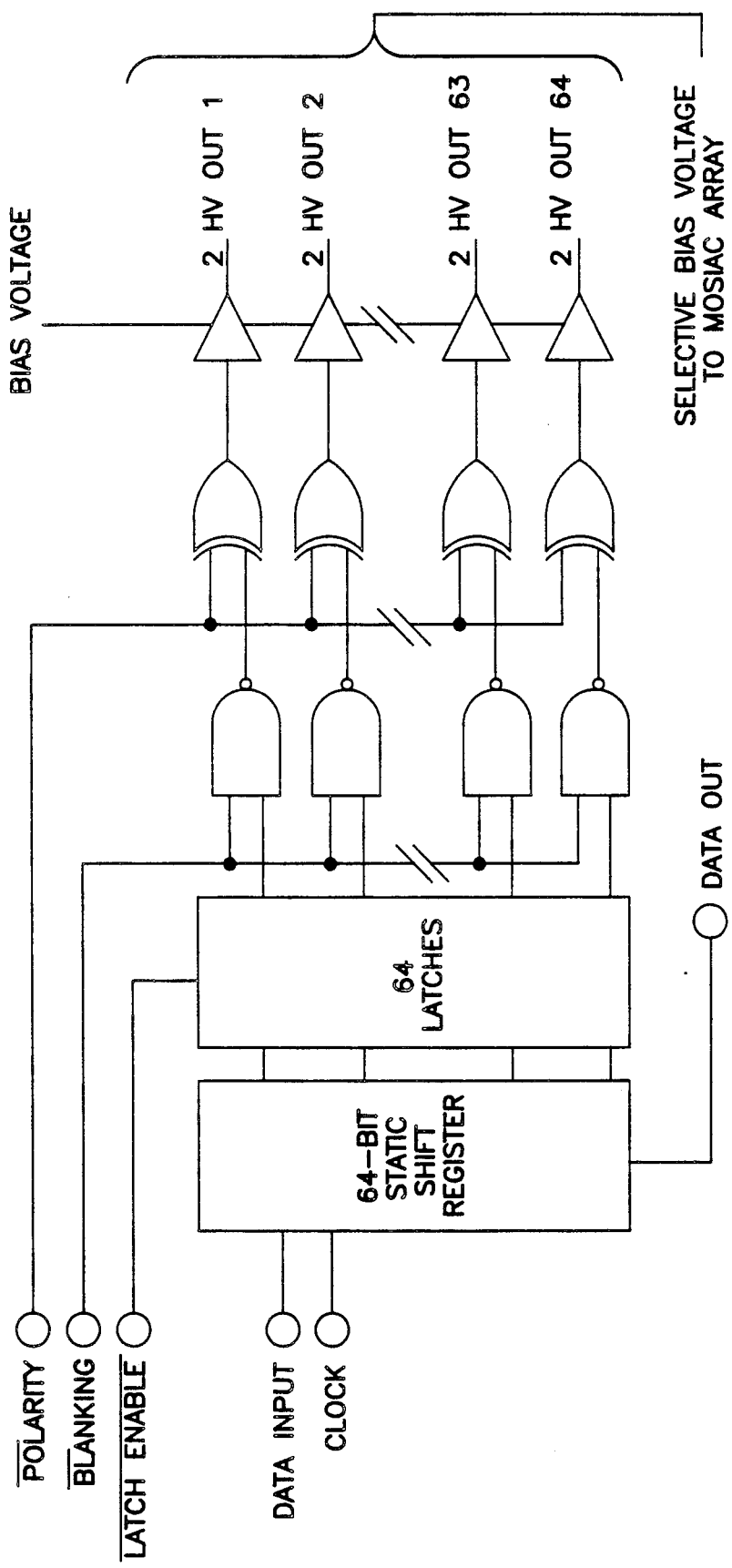
FIG. 8 is a logic diagram of a switching device of FIG. 7.

An alternative embodiment is shown in FIGS. 7 and 8. As shown in FIG. 7, detectors $D_1, D_2, \ldots D_{64}$ are connected to a VLSI switching device 120 such as a Supertex HV04. The switching device 120 is shown in greater detail in FIG. 8. The selective bias voltage to the individual detectors is controlled. FIG. 7 depicts a focal plane array which consists of 64 sets of 64 detectors arranged to form a mosaic of detectors called a 2D array or staring array. The operation for each set is exactly as described before for an individual set of 64 detectors.

The additional VLSI circuit 120 is used to apply the bias voltage to only one set of detectors at a time. Only the set to which the bias voltage is applied is active at any given time. As each set is activated by application of a bias voltage by the circuit 120 turning on the appropriate high voltage switch, the 64 detectors of that set are measured and processed and then the bias voltage is switched to the next set and the measurement of this next set of 64 detectors is made. In this manner, all 64 sets will be scanned and the data recorded prior to repeating the scan again.

As is well known, the detectors of the type disclosed herein are usually operated at a fixed temperature. Typically they are cooled to a specific temperature by liquid nitrogen or controlled by thermoelectrics. Alternatively, the temperature of the detectors can be measured and, based on the measured temperature, corrections are made to the output. These techniques are known in the art and have not been described in detail.

The foregoing description has been limited to a specific embodiment of the invention. It will be apparent, however, that variations and modifications can be made to the invention, with the attainment of some or all of the advantages of the invention. Therefore, it is the object of the appended claims to cover all such variations and modifications as come within the true spirit and scope of the invention.

Having described my invention, what I now claim is:

1. A detection system which comprises:
   a plurality of radiation responsive, variable resistive detectors, each detector having a first connector and a second connector, the first connector communicating with a bias voltage source, the second connector communicating with a switching circuit comprising a plurality of paired MOSFETs, each pair associated with a detector, the switching circuit adapted to switch the output of each detector between a signal ground and a sensor circuit which is configured with a virtual ground whereby the output of the detectors is at all times grounded;
   the sensor circuit including means to amplify the output from the detector;
   means to control the switching of the detectors between virtual ground and ground; and
   means to record the signal sensed.

2. The system of claim 1 wherein the detectors are lead salt detectors.

3. The system of claim 2 wherein the lead salt detectors are selected from the group consisting essentially of lead sulfide and lead selenide.

4. The system of claim 1 wherein the detector is connected to the drain terminal of each o the two MOSFETs of the MOSFET pair and the source terminal of one of the MOSFET pair is connected to signal ground and the source terminal of the other MOSFET of the MOSFET pair is connected to an operational amplifier input which is a virtual ground.

5. The system of claim 4 wherein the source terminals of the MOSFETs connected to signal ground are connected together.

6. The system of claim 4 wherein the source terminals of the MOSFETs connected to the operational amplifier are connected together.

7. The system of claim 1 which includes:
   means to control the gates of one of the MOSFETs of the pair such that at any given time, all the MOS- FETs to which it is connected are switched ON to ground except the MOSFET associated with the detector whose signal is to be measured which is turned OFF; and means to control the gates of the other of the MOSFETs of the pair such that at any given time, all the MOSFETs to which it is connected are switched OFF except the MOSFET associated with the detector whose signal is to be measured which is turned ON.

8. The system of claim 1 which includes:

means to selectively apply bias voltage to the detectors.

9. The system of claim 1 wherein t he sensor circuit includes an operational amplifier with one input at virtual ground.

10. The system of claim 1 which includes:

means to correct for the dark current o the detectors.

11. The system of claim 10 wherien the means to invention comprises an array of detectors $D_1$–$D_{64}$, such as correct the dark current includes a DAC which includes means to subtract the dark current.

* * * * *

UNITED STATES PATENT AND TRADEMARK OFFICE
CERTIFICATE OF CORRECTION

PATENT NO. : 5,126,552
DATED : June 30, 1992
INVENTOR(S) : Stanley B. Hayes, Jr.

It is certified that error appears in the above-indentified patent and that said Letters Patent is hereby corrected as shown below:

On the title page, Item [54] INFRARED MATRIX SENSOR WITH SIGNAL MULTIPLEXING

Column 1, line 1,-- INFRARED MATRIX SENSOR WITH SIGNAL MULTIPLEXING --.

Signed and Sealed this

Twenty-fourth Day of August, 1993

Attest:

BRUCE LEHMAN

*Attesting Officer*   *Commissioner of Patents and Trademarks*